United States Patent
Efimov et al.

(10) Patent No.: US 9,941,661 B1
(45) Date of Patent: Apr. 10, 2018

(54) SYSTEM FOR MAINTAINING THE LOCKING RANGE OF AN INJECTION LOCKED LASER ARRAY WITHIN RANGE OF THE FREQUENCY OF A MASTER LASER

(71) Applicant: HRL LABORATORIES LLC, Malibu, CA (US)

(72) Inventors: Oleg M. Efimov, Thousand Oaks, CA (US); Keyvan R. Sayyah, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 382 days.

(21) Appl. No.: 14/596,960

(22) Filed: Jan. 14, 2015

(51) Int. Cl.
*H01S 5/068* (2006.01)
*H01S 5/42* (2006.01)
(Continued)

(52) U.S. Cl.
CPC .......... *H01S 5/0687* (2013.01); *G02B 27/283* (2013.01); *H01S 5/005* (2013.01);
(Continued)

(58) Field of Classification Search
CPC ...... H01S 5/0687; H01S 5/005; H01S 5/0071; H01S 5/423; H01S 5/4006; G02B 27/283
See application file for complete search history.

(56) References Cited

U.S. PATENT DOCUMENTS 5,071,251 A  12/1991 Hochberg et al.
5,216,541 A  6/1993 Takesue et al.
(Continued)

OTHER PUBLICATIONS

Requirement for Restriction for U.S. Appl. No. 14/596,825 (currently unpublished) dated Dec. 20, 2016.
(Continued)

*Primary Examiner* — John Lee
(74) *Attorney, Agent, or Firm* — Ladas & Parry (57) ABSTRACT

A system for maintaining the locking range of an injection locked laser array within range of a frequency of a master laser includes first and second photodetectors. An injection locked laser array has a locking frequency range around a free running frequency controlled in response to a control signal. The laser array produces respective beams phase modulated at relative unique frequencies. A mask, has apertures with shapes, sizes, and positions identical to the shapes, sizes and positions of the lasers in the laser array. A first master laser produces a beam at a first frequency coupled to the laser array and illuminating the mask. A second master laser produces a beam at a second frequency separated from the first frequency by substantially the locking range of the laser array coupled to the laser array and illuminating the mask. Optics forms images of the reference beams of the first and second master lasers from the mask to the first and second photodetectors respectively, and forms images of the beams from the laser array to the same locations on the first and second photodetectors as the corresponding reference beams from the mask, A frequency controller, responsive to respective composite signals from the first and second photodetectors, detects modulation harmonics corresponding to each beam from the laser array from the first and second photodetectors and produces a frequency control signal.

26 Claims, 4 Drawing Sheets (51) Int. Cl.
*H01S 5/0687* (2006.01)
*H01S 5/40* (2006.01)
*H01S 5/00* (2006.01)
*G02B 27/28* (2006.01)

(52) U.S. Cl.
CPC .......... *H01S 5/0071* (2013.01); *H01S 5/4006* (2013.01); *H01S 5/423* (2013.01)

(56) References Cited

U.S. PATENT DOCUMENTS

| | | | | |
|---|---|---|---|---|
| 5,307,073 | A * | 4/1994 | Riza | G02F 2/002 342/368 |
| 5,387,972 | A | 2/1995 | Janz et al. | |
| 6,219,187 | B1 | 4/2001 | Hwu et al. | |
| 6,597,836 | B2 | 7/2003 | Johnson et al. | |
| 7,058,098 | B1 | 6/2006 | Shay | |
| 7,088,743 | B2 | 8/2006 | Rice et al. | |
| 7,336,363 | B2 | 2/2008 | Rothenberg | |
| 7,440,174 | B2 | 10/2008 | Rice et al. | |
| 7,499,174 | B2 | 3/2009 | Farah | |
| 7,817,282 | B2 | 10/2010 | Bowlan et al. | |
| 7,848,370 | B2 * | 12/2010 | Kewitsch | H01S 3/2308 372/23 |
| 7,995,630 | B2 * | 8/2011 | Rakuljic | H01S 5/0687 372/29.01 |
| 8,792,099 | B1 | 7/2014 | Efimov et al. | |
| 9,325,149 | B2 | 4/2016 | Hamamoto et al. | |
| 2003/0002790 | A1 | 1/2003 | Johnson et al. | |
| 2005/0201429 | A1 | 9/2005 | Rice et al. | |
| 2006/0222372 | A1 * | 10/2006 | Spinelli | H01S 3/2383 398/183 |
| 2007/0086010 | A1 | 4/2007 | Rothenberg | |
| 2008/0285031 | A1 | 11/2008 | Bowlan et al. | |
| 2009/0245306 | A1 * | 10/2009 | Rakuljic | H01S 5/4006 372/29.011 |
| 2009/0279828 | A1 * | 11/2009 | Nilsson | B82Y 20/00 385/14 |
| 2009/0296751 | A1 * | 12/2009 | Kewitsch | H01S 3/2308 372/18 |
| 2011/0150504 | A1 * | 6/2011 | Ellis | H04B 10/60 398/203 |
| 2011/0200334 | A1 * | 8/2011 | Wu | H04J 14/0221 398/79 |
| 2011/0235049 | A1 | 9/2011 | Burnett et al. | |
| 2012/0063474 | A1 * | 3/2012 | Ayotte | H01S 5/0078 372/20 |
| 2013/0308663 | A1 * | 11/2013 | Chen | H01S 5/06256 372/20 |
| 2013/0315271 | A1 * | 11/2013 | Goodno | H01S 3/2383 372/31 |
| 2015/0138618 | A1 | 5/2015 | Hamamoto et al. | |

OTHER PUBLICATIONS

Notice of Allowance issued for U.S. Appl. No. 13/332,939(now U.S. Pat. No. 8,792,099) dated Mar. 21, 2014.
T.Y. Fan, "Laser Beam Combining for High-Power, High-Radiance Sources", *IEEE J. of Selected Topics in Quan. Elect.*, vol. 11, No. 3, May/Jun. 2005, pp. 567-577.
Kenneth Li, "Etendue efficient coupling of light using dual paraboloid reflectors for projection displays," *Proc. of SPIE*, 4657, 1 (2002), pp. 1-8.
T. R. O'Meara, "Stability of an N-loop ensemble-reference phase control system," *J. Opt. Soc. Am.* 67, 315, (1977), pp. 315-318.
L. Liu, et al., "Phase-Locking of Tiled Fiber Array using SPGD Feedback Controller", Proc. SPIE 5895-5895OP-1(2005), pp. 1-9 (all pages within attached document).
U.S. Appl. No 14/998,829, filed Apr. 14, 2016, Sayyah, et al.
H.L. Stover, W.H. Steier, "Locking of Laser Oscillators by Light Injection,", Applied Physics Letters, vol. 8, No. 4, pp. 91-93, Feb. 15, 1966.
T.R. O'Meara,"The Multidither Principle in Adaptive Optics", Journal of the Optical Society of America, vol. 67, Issue 3, pp. 306-315, Mar. 1977.
O. Efimov, K. Sayyah,"Phase Measurements of Emitters From Coherent Optical Array and Method," Invention Disclosure, HRL No. 131001, submitted Oct. 1, 2013.
G.W. Johnson et al.,"Phase-locked Interferometry," Optical Engineering, vol. 18, No. 1, pp. 46-52, Jan.-Feb. 1979.
T.M. Shay,"Theory of Electronically Phase Coherent Beam Combination Without a Reference Beam," Optics Express, vol. 14, Issue 25, pp. 12188-12195, Dec. 11, 2006.
S.D. Lau et al., "Optical Phase Difference Measurement and Correction Using AlGaAs Integrated Guided-Wave Components," IEEE Photonics Technology Letters, vol. 3, No. 10, Oct. 1991, pp. 902-904.
B. Golubovic et al., Basic Module for an Integrated Optical Phase Difference Measurement and Correction System,: IEEE Photonics Technolgy Letters, vol. 7, No. 6, pp. 649-651, Jun. 1995.
From U.S. Appl. No. 14/596,825, filed Jan. 14, 2015 (Unpublished and Non Publication request filed), Application and Office Actions to issue.
U.S. Appl. No 14/596,825, filed Jan. 14, 2015, Effimov et al.
Requirement for Restriction for U.S. Appl. No. 14/596,825(currently unpublished) dated Apr. 13, 2017.
Non-final Office Action for U.S. Appl. No. 14/596,825(currently unpublished) dated Jul. 18, 2017.

* cited by examiner

SYSTEM FOR MAINTAINING THE LOCKING RANGE OF AN INJECTION LOCKED LASER ARRAY WITHIN RANGE OF THE FREQUENCY OF A MASTER LASER

STATEMENT REGARDING FEDERALLY SPONSORED RESEARCH OR DEVELOPMENT

This invention was made with Government support under Contract No. HR0011-10-C-0150 awarded by DARPA. The Government has certain rights in the invention.

CROSS-REFERENCE TO RELATED APPLICATIONS

The present application is related to U.S. patent application Ser. No. 14/596,825, filed 2015 Jan. 14 by Efimov et al. and titled "an Optical Detector for Measuring Respective Phases of Multiple Beams Apparatus and Method."

BACKGROUND OF THE INVENTION

Field of the Invention

The present invention relates to a laser array system, and in particular to a system for maintaining injection locking of all the lasers in the array to the frequency of a master laser.

Discussion of the Prior Art

An injection locked system refers to the frequency effects that can occur when a first harmonic oscillator, termed the slave oscillator, is affected by a second oscillator, termed the master oscillator, operating at a nearby frequency. When the coupling is strong enough and the frequencies are near enough, the master oscillator can capture the slave oscillator, causing it to have the same frequency as the master oscillator. This is termed injection locking. This effect is used in laser systems to lock one or more slave laser frequencies to a master laser frequency so that all the lasers produce coherent beams.

Figure 1A:
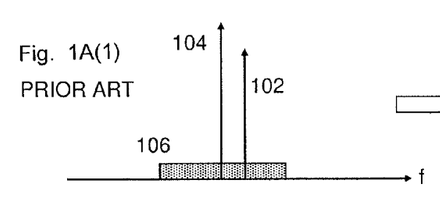
Figure 1B:
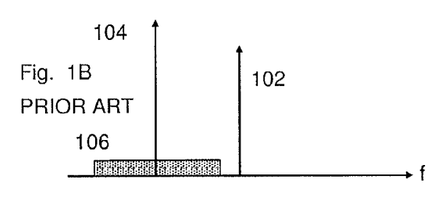
Figure 1C:
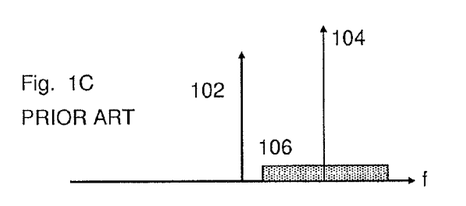

FIG. 1A(1), 1A(2) to FIG. 1C are spectrum diagrams illustrating the free running frequency 104 of one or more slave laser beams and the corresponding locking range 106 surrounding the free running frequency 104. They also illustrates the frequency 102 of a master laser beam. The height and thickness of the lines representing laser frequencies do not represent relative powers or anything else, they merely differentiate the frequency of the one or more slave laser beams from the frequency of the master laser beam in the figure. A master laser beam is coupled to the slave laser or lasers to lock the frequency 104 of those beams to the frequency 102 of the master laser beam. Referring to FIG. 1A(1), the master laser frequency 102 is within the lock range 106 of the one or more slave lasers. Consequently, the frequency of the one or more slave lasers is locked to the frequency of the master laser, as illustrated by the thick arrow in FIG. 1A(2).

Relatively small fluctuations of external factors can shift the free running frequency 104, and the corresponding locking range 106, of the one or more slave lasers. However, lasers have a relatively narrow range 106 of frequencies around its free-running frequency 104 within which it will lock to a master laser. If the frequency 102 of the master laser is not within that locking range of frequencies, then the one or more slave lasers will not lock to the master laser, and the beams will remain non-coherent. Referring to FIG. 1B, the free running frequency of the one or more slave laser beams has shifted downwards in frequency and the illustrated move is large enough that the locking range 106 has moved so that the master laser frequency 102 is not within the locking range 106 anymore. In this situation, the one or more lasers in the array will not be coherent with the master laser or with each other. Similarly, referring to FIG. 1C, the free running frequency of the one or more slave laser beams has shifted upwards in frequency and the illustrated move is large enough that the locking range 106 has moved so that the master laser frequency 102 is not within the locking range 106 anymore. In this situation, again, the one or more lasers in the array will not be coherent with the master laser or with each other.

It is desirable to provide beam steering for a laser beam array, in particular an injection locked laser array. Such an array allows electronic control of beam phases, which, in turn, allows for agile steering of the main interference lobe through the proper modification of the laser array beam phases, and does not require any mechanical means. Desired phase relations between the respective array beams are calculated for a corresponding desired interference lobe direction. Those calculated phase relations are applied to the beams from the laser array, and corrected through the application of continually detected actual phases of the beams through feedback. To provide continual control of the phases of the array beams, it is necessary to ensure that the frequency of the master laser beam remains within the locking range frequencies of all the beams in the laser array.

The multidithering technique was presented as an adaptive optics technique in 1970s. In this technique, low modulation factor sinusoidal phase modulations at relatively unique different frequencies, were applied to the respective beams of an array. Then, the signal reflected from a target was measured with a single photodetector. Phase error signals at the fundamental frequencies of the modulations were calculated and applied to each beam of the array to maximize the intensity of the beam interference pattern on the target. This technique provided beam phase locking on target through maximization or minimization of the phase error signal to maximize or minimize the intensity of the beam interference pattern, but could not be used to detect the relative phases of the individual beams.

The multidithering technique was also used in coherent beam combination of fiber lasers. It provided beam phase locking, but could not be used to detect the phases of the individual beams.

The dithering technique may further be applied to two coherent beams to measure the phase difference $\Delta\varphi$ between the beams. More specifically, if sinusoidal modulation with a modulation factor $\Gamma<\pi$ and a frequency $\omega$ is applied to one of the beams in a two-beam interferometer, the signal $V_{PD}$ from the photodetector may be used to measure the interference pattern between the modulated beam and a reference beam, and is given by:

$$V_{PD}(t) = \frac{\eta_V}{2}\left[P_s + P_r + 2\sqrt{P_s P_r}\cos(\Delta\phi + \Gamma\sin\omega t)\right] \quad (1)$$

where $P_s$ and $P_r$ are the powers from the signal and reference beams, respectively, and $\eta_v$ is the photodetector responsivity. It is preferred that the aperture of the photodetector is smaller than the distance between adjacent interference fringes. The modulation factor $\Gamma$ is measured as the ratio of $\pi V/V_\pi$ where V is a voltage or current applied to a laser output to change its phase and $V_\pi$ is the voltage or current resulting in a π-shift of phase.

The amplitudes of the modulation harmonics of a phase modulated signal are proportional to Bessel functions of the first kind, of the order of the harmonic, and with the modulation factor Γ as argument. By using a Bessel function expansion for the cosine-sine term in equation (1), the following expressions for the amplitudes of the first $A(\omega)$ and second $A(2\omega)$ harmonics can be obtained:

$$V_{PD}(t) = \tag{2}$$
$$\frac{\eta V}{2}\left[\begin{array}{l} P_s + P_r + 2\sqrt{P_sP_r}\cos\Delta\phi[J_0(\Gamma) + 2J_2(\Gamma)\cos2\omega t + \ldots\;] - \\ 2\sqrt{P_sP_r}\sin\Delta\phi[2J_1(\Gamma)\sin\omega t + 2J_3(\Gamma)\sin3\omega t + \ldots\;] \end{array}\right]$$

$$A(\omega) = 4\sqrt{P_sP_r}\,J_1(\Gamma)\sin\Delta\phi \tag{3}$$
$$A(2\omega) = 2\sqrt{P_sP_r}\,J_2(\Gamma)\cos\Delta\phi$$

where $J_n(\Gamma)$ are Bessel functions of the first kind of order n.

Referring to equation (3) above, the phase difference between the beams is:

$$\Delta\phi = \tan^{-1}\left[\frac{A(\omega)}{A(2\omega)}\frac{J_2(\Gamma)}{J_1(\Gamma)}\right] \tag{4}$$

The respective signs of the measured amplitudes $A(\omega)$ and $A(2\omega)$ allow unique determination of the phase difference quadrant.

BRIEF SUMMARY OF THE INVENTION

As described above, relatively small external factors may cause movement of the free running frequency, and the corresponding locking range, of the one or more slave lasers either higher or lower. If the movement is large enough, the frequency of the master laser may end up outside the locking range. The inventor has realized that the uncertainty in the direction of the frequency shift is a problem for frequency correction especially in the case of multiple slave lasers.

The inventor has further realized that the multidithering technique described above may be modified and used to determine whether two beams are coherent. If two beams are coherent, then an interference signal is generated between the two beams, otherwise, no interference signal will be generated. If no interference signal is generated, then there will be no harmonic signals produced by that interference. Consequently, the presence of modulation harmonics resulting from beam interference is an indication of beam coherence. In the case of beams from an injection locked array, the presence of modulation harmonics indicates that the frequency of the master laser is located within locking range of the one or more slave lasers.

In accordance with principles of the present invention a system for maintaining the locking range of an injection locked laser array within range of a frequency of a master laser includes first and second photodetectors. An injection locked laser array has a locking frequency range around a free running frequency controlled in response to a control signal. The laser array produces respective beams phase modulated at relative unique frequencies. A mask has apertures with shapes, sizes, and positions identical to the shapes, sizes and positions of the lasers in the laser array. A first master laser produces a beam at a first frequency coupled to the laser array and illuminating the mask. A second master laser produces a beam at a second frequency separated from the first frequency by substantially the locking range of the laser array coupled to the laser array and illuminating the mask. Optics forms images of the reference beams of the first and second master lasers from the mask to the first and second photodetectors respectively, and forms images of the beams from the laser array to the same locations on the first and second photodetectors as the corresponding reference beams from the mask, A frequency controller, responsive to respective composite signals from the first and second photodetectors, detects modulation harmonics corresponding to each beam from the laser array from the first and second photodetectors and produces a frequency control signal.

BRIEF DESCRIPTION OF THE DRAWINGS

FIG. 1A(1), 1A(2) to FIG. 1C are spectrum diagrams illustrating the frequency of one or more slave laser beams and the corresponding locking range, along with the frequency of a master laser beam;

FIG. 3A to FIG. 3F are diagrams of six interference patterns useful in understanding the operation of the present invention;

FIGS. 6A(1), 6A(2), 6B(1), 6B(2), and 6C are spectrum diagrams illustrating the frequency of one or more slave laser beams and the corresponding lock range, along with the frequencies of the first and second master laser beams.

DETAILED DESCRIPTION OF THE INVENTION

A multidithering technique is described in pending U.S. patent application Ser. No. 14/596,825 filed Jan. 14, 2015 titled "An Optical Detector for Measuring Respective Phases of Multiple Beams Apparatus and Method" the entire contents of which are incorporated by reference as though fully set forth herein.

Figure 2:
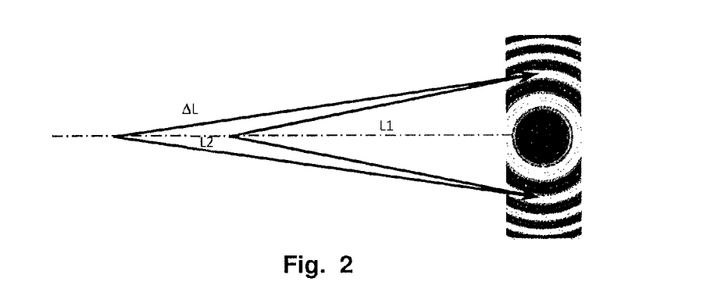
FIG. 2 is a diagram illustrating the formation of an interference pattern useful in understanding the operation of the present invention.

FIG. 2 is a diagram illustrating the formation of an interference pattern useful in understanding the operation of the present invention. There is a difference between 0-phase interference patterns and 0-fringe interference patterns. A 0-phase interference pattern means that the length difference in the optical paths of both beams is equal to 0 and the beams experience a constructive interference with the brightest fringe. Usually this occurs only for some specific direction. However, the same brightness will be observed for any directions where m (i.e. m=$\Delta L/\lambda$) is equal to an integer number. Referring to FIG. 2, L1 is the optical path for a first beam, L2 is the optical path for a second beam, $\Delta L$ is the difference in the lengths of the optical paths of beams and $\lambda$ is the wavelength. Here L1, L2, and $\Delta L$ are measured along the optical axis shown by dashed line in FIG. 2.

FIG. 3A to FIG. 3F are diagrams of six interference patterns useful in understanding the operation of the present invention. These patterns are the result of the interference of two optical beams having 1 μm wavelength produced as shown in FIG. 2. The length L1 is 50 mm. The sizes of the patterns illustrated in FIG. 3A to FIG. 3F are 2 mm×2 mm. The differences in the optical paths of the beams along the optical axis and the phase differences are described in the caption beneath the figure.

Figure 3A:
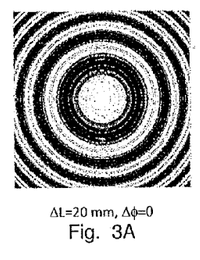
Figure 3B:
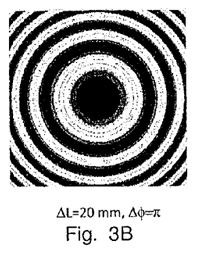
Figure 3C:
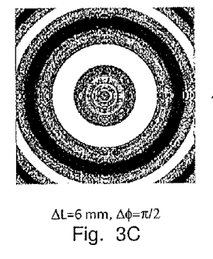
Figure 3D:
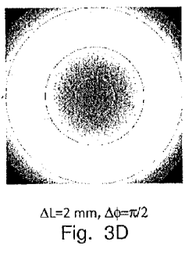

The interference patterns shown in FIG. 3A and FIG. 3B are for m=20000 μm/1 μm=20000. FIG. 3A has the same highest available intensity as for m=0 (not illustrated). If the phase difference is shifted by π, then the pattern has the lowest intensity. This situation is shown in FIG. 3B, also with m>>0. If the optical path difference is reduced from 20 mm to 6 mm, as shown in FIG. 3C, the number of fringes over the same area, or the frequency of fringes, is reduced. If the optical path difference is further reduced to 2 mm, the frequency of fringes or the number of visible fringes is further reduced as illustrated in FIG. 3D.

Figure 3E:
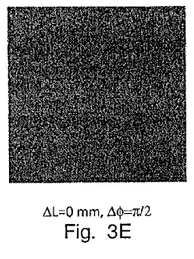
Figure 3F:
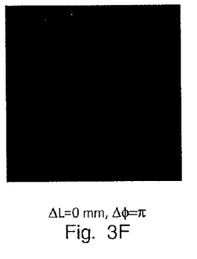

If the optical path difference is reduced to zero everywhere on the responsive area of the photodetector, the same intensity pattern is produced independent of the position of the interference pattern on the responsive area of the photodetector, that is, the frequency of fringes is equal to 0. This is termed the 0-fringe pattern in the remainder of this application. Such patterns are shown in FIG. 3E for $\Delta\varphi=\pi/2$ and in FIG. 3F for $\Delta\varphi=\pi$ phase differences between the beams, respectively. In these figures, the optical path difference $\Delta L=0$ which means that m=0 also. One skilled in the art further understands that the 0-fringe pattern can be implemented with different optics for any value of m-number.

Figure 4:
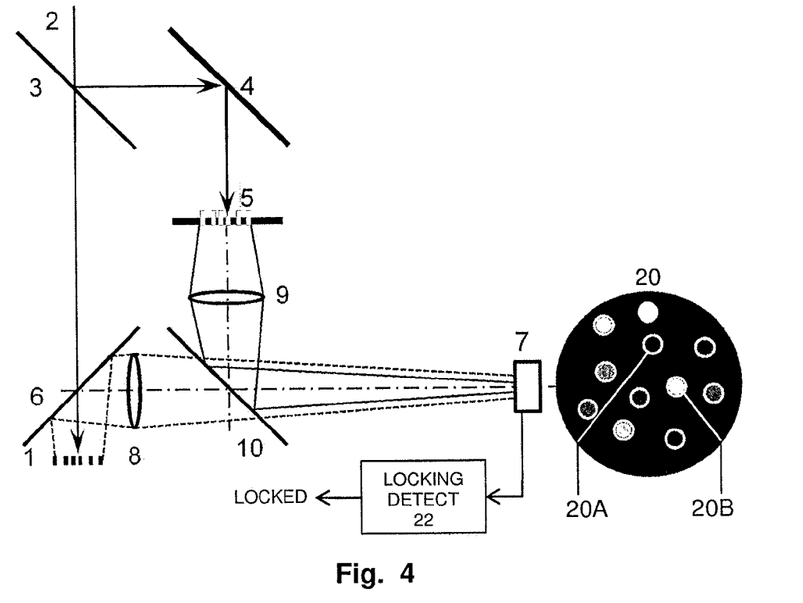
FIG. 4 is a diagram illustrating the arrangement of optics useful in understanding the operation of a system in accordance with principles of the present invention.

A system according to the present invention is related to the method for measuring a phase difference between a beam and a reference beam, disclosed above. FIG. 4 is a diagram useful in understanding the operation of a system in accordance with principles of the present invention, In FIG. 4, such a system includes an injection locked vertical cavity surface emitting laser (VCSEL) array 1. The VCSEL array 1 is illuminated with a narrowband reference beam 2 having a frequency near the free running frequencies of the VCSELs, i.e. within the locking range, to provide locking of the beams in the array into coherent beams. A portion of the power of the reference beam 2 is reflected by beamsplitter 3 to a mirror 4 and then to a mask 5. The radiation of the injection locked array 1 is partially reflected by beamsplitter 6 and imaged on the photosensitive area of photodetector 7 through a lens 8. The mask 5 has apertures with shapes, sizes, and positions identical to the shapes, sizes, and positions of the beams in the VCSEL array 1. The reference beam 2 has a planar wavefront to provide the same phases through all the apertures in mask 5. The mask 5 is positioned at the same distance from the photodetector 7 as the array 1 and imaged on the photodetector 7 through a lens 9 identical to the lens 8. Beams from the array 1 and mask 5 are combined with each other by beamsplitter 10 to generate respective 0-fringe interference images, termed 0-fringe interferences in the remainder of this application, on the photodetector 7. Phase modulations are applied to the array 1 of coherent beams or to the reference beams developed by the mask 5. The output signal from the photodetector 7 is coupled to a locking detector 22. The locking detector 22 analyzes this signal and produces a signal representing the locking state of the beams in the array 1, in a manner described in more detail below.

The images of the combined beams from the array 1 and the corresponding reference beams from the mask 5 are illustrated on the photosensitive portion 20 of the photodetector 7. Because the beams from the array 1 have random phases, the images of the interfering beams have different intensities depending on phase difference between the reference beam 2 and the beam from array 1, as shown by grayscale in 20. If a beam from array 1 is in phase with the reference beam 2, the images on the photodetector 7 reinforce, and the image is bright, as illustrated in 20B. If a beam from array 1 is π out of phase with the reference beam 2, the images on the photodetector 7 cancel and the image is dark, as illustrated in 20A.

A sinusoidal phase modulation is applied to the N beams from array 1. Each beam i from array 1 is modulated at a known, unique frequency $\omega_i$ with an modulation factor $\Gamma_i<\pi$. The frequencies $\omega_i$ do not need to be related in any way so long as they are unique. However, one skilled in the art understands that if the frequencies are selected properly, then the signal processing may be simplified. More specifically, if the frequencies are selected to be equally spaced from $\omega_1$ to $\omega_N$, then the composite signal from the photodetector may be processed by Fourier analysis, in a manner described in more detail below.

The separate 0-phase interference patterns on the photodetector 7 cause a composite signal to be generated by the photodetector 7 containing components caused by each separate interference pattern. The composite signal $V_{PD}(t)$ from photodetector 7 with a responsivity $\eta_V$ is given by:

$$V_{PD}(t) = \frac{\eta_V}{2} \sum_{i=1}^{N} \left[ P_i^s + P_i^r + 2\sqrt{P_i^s P_i^r} \cos(\Delta\phi_i + \Gamma_i \sin\omega_i t) \right] \quad (5)$$

where $P_i^s$ and $P_i^r$ are the powers of the $i^{th}$ array 1 and reference 2 beams respectively, $\Delta\varphi_i$ is the phase difference between $i^{th}$ array 1 and reference 2 beams, N is the total number of beams in array 1, $\omega_i$ is the frequency of the modulating signal of the $i^{th}$ array beam 1, and $\Gamma_i$ is the modulation factor of the modulation of the $i^{th}$ array beam.

Amplitudes of harmonics of a phase modulated signal are proportional to Bessel functions of the first kind, with the order of the harmonic, and with the modulation factor as the argument. By using a Bessel function expansion for the cosine-sine term in (5) as previously, the following expressions can be obtained:

$$V_{PD}(t) = \frac{\eta_V}{2} \quad (6)$$

$$\sum_{i=1}^{N} \left\{ \begin{array}{l} P_i^s + P_i^r + 2\sqrt{P_i^s P_i^r} \cos\Delta\phi_i [J_0(\Gamma_i) + 2J_2(\Gamma_i)\cos 2\omega_i t + \ldots\ ] - \\ 2\sqrt{P_i^s P_i^r} \sin\Delta\phi_i [2J_1(\Gamma_i)\sin\omega_i t + 2J_3(\Gamma_i)\sin 3\omega_i t + \ldots\ ] \end{array} \right\}$$

where $J_n(\Gamma_i)$ are Bessel functions of the first kind of order n and having argument $\Gamma_i$.

Highlighting the terms representing individual sidebands:

$$V_{PD}(t) = \frac{\eta_V}{2} \sum_{i=1}^{N} \left\{ \begin{array}{l} \left[ P_i^s + P_i^r + 2\sqrt{P_i^s P_i^r} J_0(\Gamma_i)\cos\Delta\phi_i \right] - \\ \left[ 4\sqrt{P_i^s P_i^r} J_1(\Gamma_i)\sin\Delta\phi_i \right] \sin\omega_i t + \\ \left[ 4\sqrt{P_i^s P_i^r} J_2(\Gamma_i)\cos\Delta\phi_i \right] \cos 2\omega_i t - \\ \left[ 4\sqrt{P_i^s P_i^r} J_3(\Gamma_i)\sin\Delta\phi_i \right] \sin 3\omega_i t + \ldots \end{array} \right\} \quad (7)$$

The amplitudes of the first $A(\omega_i)$ and second $A(2\omega_i)$ harmonics may be calculated:

$$A(\omega_i) = 4\sqrt{P_i^s P_i^r} J_1(\Gamma_i)\sin\Delta\phi_i \quad (8)$$

-continued $$A(2\omega_i) = 4\sqrt{P_i^s P_i^r} J_2(\Gamma_i)\cos\Delta\phi_i$$

If it is further desired to determine the respective phase differences between the beams in the array and the corresponding reference beams 2, the respective phases may be calculated as:

$$\Delta\phi_i = \tan^{-1}\left[\frac{A(\omega_i)}{A(2\omega_i)}\frac{J_2(\Gamma)}{J_1(\Gamma)}\right] \quad (9)$$

As described above, careful selection of the frequencies $\omega_i$ allows the extraction of the harmonics of all the frequencies $\omega_i$ using a Fourier analysis, and in particular a digital Fourier transform. More specifically, the frequencies $\omega_i$ are selected to be equally spaced between a lower frequency $\omega_1$ and an upper frequency $\omega_N$. One skilled in the art also understands what criteria must be satisfied in the selection of these frequencies and in the sampling rate for the composite signal to allow a Fourier transform to operate. When the criteria for using a Fourier analysis have been met, then the amplitudes $A(\omega_i)$ and $A(2\omega_i)$ may be calculated as the magnitude of the first and second harmonic signals from the Fourier transform, respectively, of the component i.

Equations (5) to (8) produce signals representing amplitudes of harmonics only if the beams from array 1 and the reference beam 2 are coherent. That is, they apply only if the array 1 is locked to the reference beam 2. If the array 1 is not locked to the reference beam 2, then the harmonics are not detected. In order to determine whether the beams from array 1 are coherent and locked to the reference beam 2, the presence of harmonics of every frequency $\omega_i$ is checked. The presence of at least one harmonic (it is possible for one of the harmonics to be equal to 0) indicates that the $i^{th}$ beam from array 1 is coherent with reference beam and its frequency is in the locking range. The absence of harmonics of frequency $\omega_i$ indicates that the reference beam 2 is out of locking range of the $i^{th}$ laser in the array 1. The locking detector 22 (of FIG. 4), performs these calculations and produces a signal representing the locking state of the array 1 in response to the composite signal from the photodetector 7.

If one or more of the beams in the array 1 is not locked to the beam 2, it is inferred that the free running frequency of the VCSEL forming the array 1 has drifted away from the frequency of the master injection laser beam 2. The frequency of VCSEL may be adjusted by the proper correction of its control signal, if the direction of shift is known. However, the information derived above is insufficient to determine in which direction the frequency has drifted.

To detect the direction of a frequency drift, a second narrowband master laser also impinges on the array 1. The second master laser beam has a frequency separated from the frequency of the first master laser by a distance substantially equal to the locking range of the laser array. The first and second master laser beams are polarized orthogonally to each other. In this application, the respective master laser beams are polarized in the P and S directions. This polarization allows separate measurements to be made of interfering signals from the first and second lasers.

Figure 5:
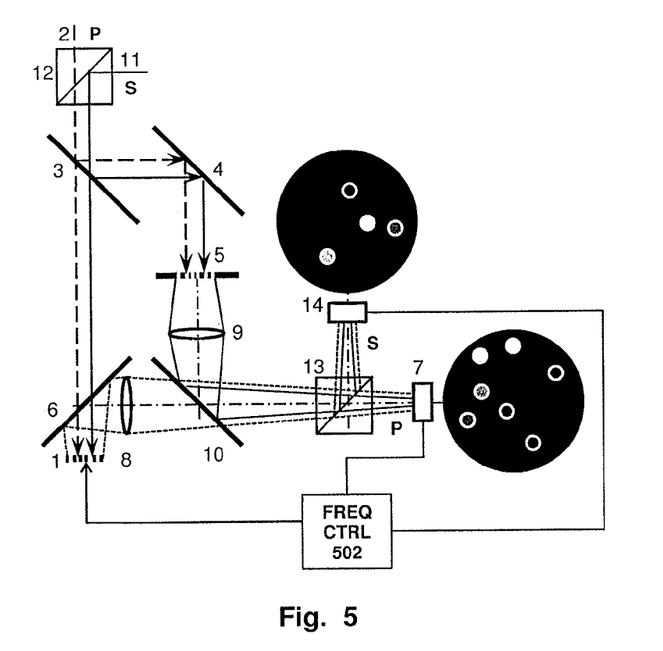
FIG. 5 is a diagram illustrating the arrangement of optics in an embodiment of a system in accordance with principles of the present invention.
Figure 6A:
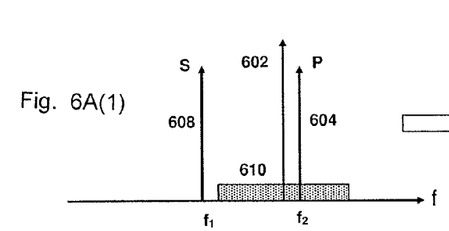
Figure 6B:
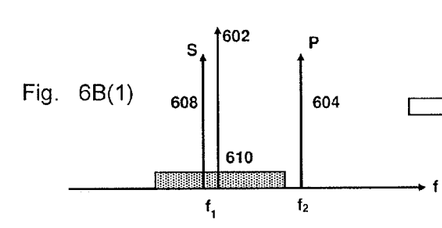
Figure 6C:
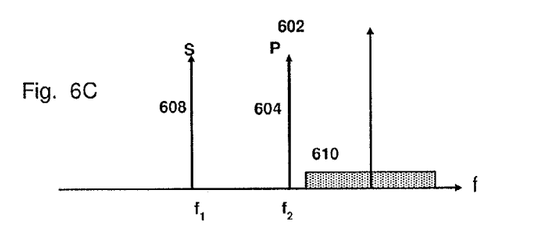

FIG. 5 is a diagram illustrating the arrangement of an embodiment of a system in accordance with principles of the present invention, and FIG. 6 is a spectrum diagram illustrating the frequency of one or more slave laser beams and the corresponding locking range, along with the frequencies of the first and second master laser beams. In FIG. 5, those elements which are the same as those illustrated in FIG. 4 are designated with the same reference number and are not discussed in detail. In FIG. 5, two narrowband master lasers 2 and 11, having orthogonal polarizations P and S, respectively, and a difference in frequency, as described above, are combined and sent in the same direction by a first polarization beam splitter 12. A second polarization beam splitter 13 is placed between the beamsplitter 10 and the photodetector 7. The second polarization beam splitter 13 is oriented such that it passes the combined array 1 and mask 5 beams with P polarization to the photodetector 7, and passes the combined array 1 and mask 5 beams with S polarization to a photodetector 14. A frequency controller 502 is coupled to the first photodetector 7 and the second photodetector 14, and produces a control signal coupled to the laser array 1, for controlling the free running frequencies of the lasers in the laser array.

Referring to both FIG. 5 and FIGS. 6A(1) and 6A(2), master beam 2 (604) has P-polarization and a higher frequency and master beam 11 (608) has S-polarization and a lower frequency. In operation, assume initially that the free running frequency (602) of the beams in the VCSEL array 1 is located so that its locking range (610) encompasses the frequency (604) of master laser 2. This is illustrated in FIG. 6A(1), on the left. In this case, the frequencies (602) of the respective beams from the VCSELs in array 1 are locked to the frequency (604) of master laser 2. This is illustrated in FIG. 6A(2), on the right. Because the beam from the master laser 2 is P polarized, the injection locked radiation of all the beams in the VCSEL array 1 also have P polarization. As described above, the combined P-polarized VCSEL array 1 beams and corresponding P-polarized master laser beam 2 from mask 5 are transmitted through the polarization beam splitter 13 to produce respective interference signals on the photodetector 7. Fourier analysis of the signal in the manner described in detail above shows the presence of harmonics and, thus, confirms the master laser 2 to have a frequency within the locking range of the VCSEL array 1.

If the free running frequency of the VCSEL array 1 shifts down in frequency from that of the master laser 2, then the free running frequency (602) of the beams in VCSEL array 1 is located so that its locking range (610) encompasses the frequency (608) of master laser 11 and not the frequency (604) of master laser 2. This is illustrated in FIG. 6B(1), on the left. In this case, the frequencies (602) of the respective beams from the VCSELs in array 1 are locked to the frequency (608) of master laser 11, which has S polarization. This is illustrated in FIG. 6B(2), on the right. Because the beam from the master laser 11 is S polarized, the injection locked radiation of all the beams in the VCSEL array 1 will be S polarized. As described above, both the S-polarized respective VCSEL array 1 beams and the corresponding S-polarized master laser beams 11 after the mask 5 are split out in the polarization beam splitter 13 to produce respective interference signals on the photodetector 14. Fourier analysis of the signal from photodetector 14 in the manner described in detail above shows the presence of harmonics and, thus, confirms that the master laser 11 is within the locking range of the VCSEL array 1 and that the respective beams in the VCSEL array 1 are locked to the frequency of the master laser 11 and not to the frequency of the master laser 2. In response to the signals from photodetector 7 and photodetector 14, the frequency controller 502 detects this condition and generates a control signal applied to the VCSEL 1 array to shift the free running frequency (602) of the VCSEL array 1 up so that the locking range 610 encompasses the frequency (604) of the beam of the master laser beam 2 (604), as illustrated in FIGS. 6A(1) and 6A(2).

If the free running frequency (602) of the VCSEL array 1 shifts up in frequency so that the locking range (610) does not encompass the frequency (604) of the master laser 2, then the respective beams in the VCSEL array 1 will not be injection locked by either of the master lasers 2 or 11, and will not be coherent. This is illustrated in FIG. 6C. Consequently, Fourier analysis of the signals from both the photodetector 7 and the photodetector 14 will show the absence of harmonics. This indicates that the VCSEL array 1 lock range (610) is higher than the frequency (604) of the master laser 2, otherwise harmonics would have been detected in the photodetector 14 signal. In response to the signals from the photodetector 7 and the photodetector 14, the frequency controller 502 detects this condition and generates a control signal applied to the VCSEL array 1 to shift the VCSEL frequency down so the locking range (610) encompasses the frequency (604) of the beam of the master laser 2, as illustrated in FIGS. 6A(1) and 6A(2).

Continuous measurements and Fourier analysis of interference signals from photodetectors 7 and 14 allow maintenance of the free running frequency (602) of the injection locked laser array 1 so that its locking range (610) encompasses the frequency (604) of the desired master laser 2. If phase measurements of injection locked VCSEL array 1 are also required, then calculations according to equations 1-9, above, are made in response to the signal from photodetector 7.

One skilled in the art understands that different optics, schematics and modifications may be used. The skilled practitioner understands how to design and implement such arrangements and modifications, and understands tradeoffs arising from the design choices.

The invention claimed is:

1. A system for controlling the locking range of a laser array within a range of a frequency of a master laser, comprising:
   the laser array having a locking frequency range around a free running frequency controlled in response to a control signal and producing beams of the laser array;
   the master laser comprising a first and a second master laser;
   a photodetector;
   the first master laser producing a reference beam at a first frequency coupled to the laser array;
   the second master laser producing a reference beam at a second frequency separated from the first frequency and coupled to the laser array;
   optics for:
      directing reference beams of the first and second master lasers to locations on the photodetector,
      directing the beams from the laser array to the same locations on the photodetector as the reference beams; and
   a frequency controller responsive to signals from the photodetector for detecting modulation harmonics corresponding to each beam from the laser array and producing the frequency control signal.

2. The system of claim 1, wherein a phase modulator modulates one of (a) the beams from the laser array and (b) the beams from the first master laser and second master laser and modulates at known frequencies.

3. The system of claim 2, wherein the reference beams of the first and second master lasers are produced by illuminating a mask having apertures with a first master laser and a second master laser, respectively.

4. The system of claim 3, wherein the apertures have shapes, sizes, and positions corresponding to the shapes, sizes and positions of the lasers in the laser array; and wherein the phase modulator modulates the beams from the laser array.

5. The system of claim 3, wherein:
   the photodetector is a first and second photodetector, wherein the optics for directing the reference beams and the beams from the laser array is further for:
   forming images of the reference beams of the first and second master lasers from the mask to the first and second photodetectors, respectively; and
   forming images of the beams from the laser array to the same locations on the first and second photodetectors as the corresponding reference beams from the mask.

6. The system of claim 5, wherein the frequency controller detects modulation harmonics and:
   if no harmonic is detected in the respective composite signals from the first and second photodetectors, then producing a frequency control signal to move the free running frequency of the laser array in a first direction until the locking range of the laser array encompasses the frequency of the first master laser; and
   if no harmonic is detected in the composite signal from the first photodetector, and at least one harmonic is detected in the composite signal from the second photodetector, then producing a frequency control signal to move the free running frequency of the laser array in a second direction opposite from the first direction until the locking range of the laser array encompasses the frequency of the first master laser.

7. The system of claim 5 wherein the frequency controller comprises:
   circuitry responsive to the signal from the first photodetector for detecting modulation harmonics in the respective beams from the laser array; and
   circuitry responsive to the signal from the second photodetector for detecting modulation harmonics in the respective beams from the laser array.

8. The system of claim 5 wherein the optics for forming images of the reference beams of the first and second master laser from the mask on the first and second photodetectors, respectively, comprises:
   a first polarizing beam splitter having a first input receiving a beam from the first master laser, a second input receiving a beam from the second master laser, and an output producing a composite beam having a component from the first master laser having a first polarity and a component from the second master laser having a second polarity orthogonal to the first polarity, wherein the composite beam from the output illuminates the mask; and
   a second polarizing beam splitter having an input receiving the beam from the mask, a first output producing the beam from the first master laser illuminating the first photodetector, and a second output producing a beam from the second master laser illuminating the second photodetector.

9. The system of claim 8 wherein beams from the laser array locked to beams from the first master laser are polarized in the first direction and illuminate the first photodetector, and beams from the laser array locked to beams from the second master laser are polarized in the second direction and illuminate the second photodetector.

10. The system of claim 9, further comprising a phase modulator configured to modulate the beams in the laser array at known frequencies, wherein:
the modulating frequencies for the beams in the laser array are selected to be equally spaced; and
the frequency controller comprises circuitry for detecting modulation harmonics using a Fourier transform of the signals from the first and second photodetectors, respectively.

11. The system of claim 8 wherein the optics for forming images of the reference beams of the first master laser from the mask on the first photodetector, and for forming images on the reference beams of the second master laser from the mask on the second photodetector further comprises a beam splitter receiving the composite beam from the first polarizing beam splitter and having a first output producing a first composite beam illuminating the laser array, and a second output producing a second composite beam illuminating the mask.

12. The system of claim 11 wherein the optics for forming images of the reference beams of the first master laser from the mask on the first photodetector, and for forming images of the reference beams of the second master laser from the mask on the second photodetector further comprises a mirror receiving the composite beam from the beam splitter and producing a beam illuminating the mask.

13. The system of claim 8 wherein the optics for forming images on the beams from the laser array on the same locations on the first and second photodetectors as the corresponding reference beams from the mask comprises a beam splitter receiving the beams from the laser array, and producing beams illuminating the second polarizing beam splitter.

14. The system of claim 1, wherein the first frequency is separated from the second frequency by substantially the locking range of the laser array.

15. The system of claim 1, wherein:
controlling is maintaining and the laser array is injection locked to one of (a) the first master laser and (b) the second master laser.

16. A system for detecting the locking of a laser array to a master laser, comprising:
the laser array;
the master laser coupled to the laser array;
a photodetector;
a modulator for phase modulating beams from one of: (a) the laser array, and (b) the master laser;
optics for:
directing beams from the master laser to locations on the photodetector; and
directing the beams from the laser array to the same locations on the photodetector as the beams from the master laser; wherein
the modulated beams from one of: (a) the laser array, and (b) the master laser are directed to the locations on the photodetector; and
detecting circuitry, responsive to a signal from the photodetector, for detecting at least one modulation harmonic corresponding to each beam from the laser array, and generating a signal indicating a locking state of the laser array to the master laser.

17. The system of claim 16, wherein the reference beams are produced by illuminating a mask having apertures with the beam from the master laser.

18. The system of claim 17, wherein the apertures have shapes, sizes, and positions corresponding to the shapes, sizes and positions of the lasers in the laser array.

19. The system of claim 17 wherein the modulator phase modulates the respective beams from the one of: (a) the laser array, and (b) the master laser after the mask, at relatively unique different frequencies.

20. The system of claim 17 wherein:
the modulator phase modulates the respective beams from the one of the (a) the laser array, and (b) the master laser after the mask, at equally spaced frequencies; and
the detecting circuitry performs a Fourier analysis on the signal from the photodetector to detect the at least one harmonic for all the beams in the laser array.

21. The system of claim 17, wherein the optics are further for illuminating the mask with the beam from the master laser and further comprise:
a beam splitter; and
a mirror.

22. The system of claim 17, wherein the optics are for:
illuminating the mask with the beam from the master laser to produce the reference beams corresponding to the respective beams from the laser array;
forming images of the reference beams from the mask on the photodetector; and
forming images of the beams from the laser array on the same locations on the photodetector as the corresponding reference beams from the mask.

23. The system of claim 22, wherein the optics for forming images of the reference beams from the mask on the photodetector comprises:
a lens; and
a beam splitter.

24. The system of claim 22, wherein the optics for forming images of the beams from the laser array on the photodetector comprises:
a first beam splitter;
a lens; and
a second beam splitter.

25. The system of claim 16 wherein the detecting circuitry comprises:
circuitry for separating component modulation signals from the composite photodetector signal for all beams from the laser array; and
circuitry for detecting at least one harmonic in each component from the separating circuitry; and
if the detecting circuitry detects at least one harmonic in each component, generating a signal indicating that the laser array is locked to the master laser.

26. The system of claim 16, wherein generating the signal comprises generating the signal indicating that the laser array is locked to the master laser if at least one modulation harmonic is detected for all beams from the laser array.

* * * * *